(12) United States Patent
Ryu et al.

(10) Patent No.: US 9,241,411 B2
(45) Date of Patent: Jan. 19, 2016

(54) SUBSTRATE HAVING TRANSPARENT ELECTRODE FOR FLEXIBLE DISPLAY AND METHOD OF FABRICATING THE SAME

(71) Applicant: LG DISPLAY CO., LTD., Seoul (KR)

(72) Inventors: KyungYeol Ryu, Incheon (KR); JinWuk Kim, Goyang-si (KR); ByungGeol Kim, Paju-si (KR); SungWoo Kim, Paju-si (KR); ChangWoo Chun, Cheonan-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 14/102,765

(22) Filed: Dec. 11, 2013

(65) Prior Publication Data

US 2014/0158411 A1    Jun. 12, 2014

(30) Foreign Application Priority Data

Dec. 12, 2012  (KR) .................. 10-2012-0144627

(51) Int. Cl.
*H05K 1/00*     (2006.01)
*H05K 3/00*     (2006.01)
*H01L 51/52*    (2006.01)
*H01L 51/00*    (2006.01)

(52) U.S. Cl.
CPC ............ *H05K 3/007* (2013.01); *H01L 51/0021* (2013.01); *H01L 51/0048* (2013.01); *H01L 51/0097* (2013.01); *H01L 51/5206* (2013.01); *H01L 2251/5338* (2013.01); *Y02E 10/549* (2013.01)

(58) Field of Classification Search
CPC .. H05K 1/0373; H05K 3/007; H01L 51/5206; H01L 51/0048; H01L 51/0097; H01L 51/0021
See application file for complete search history.

(56) References Cited

U.S. PATENT DOCUMENTS

| 8,692,798 | B1 * | 4/2014 | Zhang ......................... 345/174 |
| 2008/0143906 | A1 * | 6/2008 | Allemand .............. B82Y 10/00 349/43 |
| 2010/0243295 | A1 * | 9/2010 | Allemand .............. B82Y 10/00 174/250 |
| 2010/0255323 | A1 * | 10/2010 | Nakamura ............... H01B 1/22 428/457 |
| 2012/0228110 | A1 * | 9/2012 | Takahashi et al. ............ 200/600 |
| 2013/0109263 | A1 * | 5/2013 | Yahiaoui et al. .............. 442/148 |

OTHER PUBLICATIONS

Pei et al. (WO/2012040637).*

* cited by examiner

*Primary Examiner* — Tuan T Dinh
*Assistant Examiner* — Steven T Sawyer
(74) *Attorney, Agent, or Firm* — Brinks Gilson & Lione

(57) ABSTRACT

A substrate having a transparent electrode for a flexible display which has flexibility and transparency and is resistant to stress of bending, and a method of fabricating the same are provided. By forming a transparent electrode of nanowires resistant to stress of bending on a substrate formed of a shape memory polymer (SMP) material, an increase in resistance due to bending can be prevented and the original form can be recovered. The method for fabricating a substrate having a transparent electrode for a flexible display includes: applying a nanowire dispersion solution of methanol to a glass substrate to form a nanowire electrode; coating the glass substrate with the nanowire electrode formed thereon, with an acrylic shape memory polymer (SMP) to form an SMP thin film; curing the SMP thin film through UV irradiation to form an SMP substrate; and removing the glass substrate from the SMP substrate.

12 Claims, 6 Drawing Sheets

SUBSTRATE HAVING TRANSPARENT ELECTRODE FOR FLEXIBLE DISPLAY AND METHOD OF FABRICATING THE SAME

CROSS-REFERENCE TO RELATED APPLICATION

Pursuant to 35 U.S.C. §119(a), this application claims the benefit of earlier filing date and right of priority to Korean Application No. 10-2012-0144627, filed on Dec. 12, 2012, the contents of which is incorporated by reference herein in its entirety.

BACKGROUND

1. Field of the Disclosure

The present disclosure relates to a substrate having transparent electrode for a flexible display and a method of fabricating the same, and more particularly, to 2. Background Recently, as interest in information displays has been on the rise and demand for the use of portable information media has been increased, lightweight flat panel displays (FPDs) substituting cathode ray tubes (CRTs) as existing display devices have been actively researched and commercialized.

In the FPD fields, a liquid crystal display (LCD) device, which is lighter and consumes less power, has been spotlighted so far, and recently, a development of a new display device has been actively made to meet various demands.

An organic light emitting diode (OLED) display device, one of new display devices, is a self-luminous type device, which thus is excellent in a viewing angle and contrast ratio, is lighter and thinner because it does not need a backlight, and is advantageous in terms of power consumption, relative to an LCD device. In addition, an OLED display device can be driven by a DC and at a low voltage, has a fast response speed, and is especially advantageous in terms of fabrication costs.

A thin film formed of a material having high electrical conductivity, while having transparent optical characteristics, is required to fabricate most flat panel display devices including an OLED display, and currently, a transparent conducting oxide (TCO) such as oxide indium tin oxide (ITO), indium zinc oxide (IZO), or the like, on the basis of indium oxide has been commonly used as a material of a transparent electrode.

TCO generally refers to an electroconductive metal oxide having light transmittance, which is defined as material having visible light transmittance of 80% or greater and conductivity of $10^{-3}/\Omega cm$ or less in a 400 nm to 700 nm wavelength region. So far, TCO has been used as an important material in flat panel displays including LCDs, OLED displays, plasma display panels (PDPs), and the like, lighting devices such as solar cells including thin film solar cells, LEDs, and the like.

ITO, one of the most widely used TCO, has various advantages such as high visible light transmission, low electric resistance, and the like. However, an increase in consumption of indium has triggered lack of resources, and a resultant increase in cost of indium and environmental problems due to toxicity of indium lead to requirement of development of a substitute material that may complement the problems.

Meanwhile, flexible displays that may be folded or rolled without being damaged are expected as novel technologies in the flat panel display fields, and in line with the development of technologies, LCDs, OLED displays, or electrophoretic display devices are anticipated to become the mainstream.

In order to apply various transparent electrodes to flexible displays, technologies of substituting ITO to enhance flexibility of thin films have been developed.

Among them, a single-walled carbon nanotube (SWNT) retains high electric charge transfer state due to very low sheet resistance and a formation of mutual networks between SWNTs.

A high length/diameter ratio of SWNT means that SWNT itself may be stretched to 100% or more, providing excellent flexibility to SWNT electrodes.

FIG. 1 is a graph showing a change in sheet resistance of an ITO electrode and an SWNT electrode over a bent angle.

Referring to FIG. 1, the SWNT electrode has sheet resistance of 103 Ω/sq or less, exhibiting excellent electrical conductivity, and has transmittance of 80% or more in a wavelength range of visible light from 400 nm to 800 nm, exhibiting excellent transmittance. For example, the SWNT electrode exhibits 80% of transmittance in a wavelength range of 550 nm and typical sheet resistance of 200Ω per square.

Here, it can be seen that the ITO electrode fabricated through sputtering has excellent electrical conductivity and transparency, but resistance thereof is sharply increased as cracks are generated due to repeated mechanical stimulation, for example, bending.

Thus, although the ITO electrode has sheet resistance superior to that of the SWNT electrode, but when the ITO electrode is folded even once, cracks are formed on the bent surface, rapidly increasing resistance, and thus, it cannot be used as a transparent electrode for a flexible display.

Also, as mentioned above, the ITO electrode involves the problem of an increase in cost due to depletion of indium and is impossible to form a pattern according to a roll-to-roll scheme to be applied to a large scale flexible display.

In comparison, the SWNT electrode and a conductive polymer electrode have excellent mechanical flexibility, but having a high sheet resistance value, and thus, it is somewhat ineligible to be applied to a large scale OLED display or a polymer solar cell.

Also, a glass substrate commonly used as a substrate of the SWNT electrode is advantageous in stability in an electrode formation or a fabrication process. However, since a glass substrate is heavy and solid, it is not appropriate for flexible displays or next-generation displays for mobile communication.

Namely, a glass substrate used as a substrate of a flat panel display is thin, having a thickness of 0.7 mm or some. However, in terms of characteristics, a glass substrate is readily broken, and when it is used as a mobile display such as a cellular phone, or the like, or applied to a large scale display, a protective window formed of glass or acryl is additionally required. Also, a glass substrate is not bent.

Various flexible substrates that may overcome such shortcomings have been developed. Among them, in case of polyimide used as a heat-resistant film, concentration of chains due to chemosystematically strong charge-transfer complex and π-conjugation reveal (or express) yellowish or brownish color, degrading transmission and transparency.

SUMMARY

A substrate having a transparent electrode for a flexible display includes: a substrate formed of a shape memory polymer (SMP); and a transparent electrode formed of nanowires on the substrate.

In another aspect, a method for fabricating a substrate having a transparent electrode for a flexible display, includes: applying a nanowire dispersion solution of methanol to a glass substrate to form a nanowire electrode; coating the glass substrate with the nanowire electrode formed thereon, with an acrylic shape memory polymer (SMP) to form an SMP thin film; curing the SMP thin film through UV irradiation to form an SMP substrate; and removing the glass substrate from the SMP substrate.

Further scope of applicability of the present application will become more apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from the detailed description.

BRIEF DESCRIPTION OF THE DRAWINGS

The accompanying drawings, which are included to provide a further understanding of the invention and are incorporated in and constitute a part of this specification, illustrate exemplary embodiments and together with the description serve to explain the principles of the invention.

In the drawings.

DETAILED DESCRIPTION OF THE EXEMPLARY EMBODIMENTS

Figure 1:
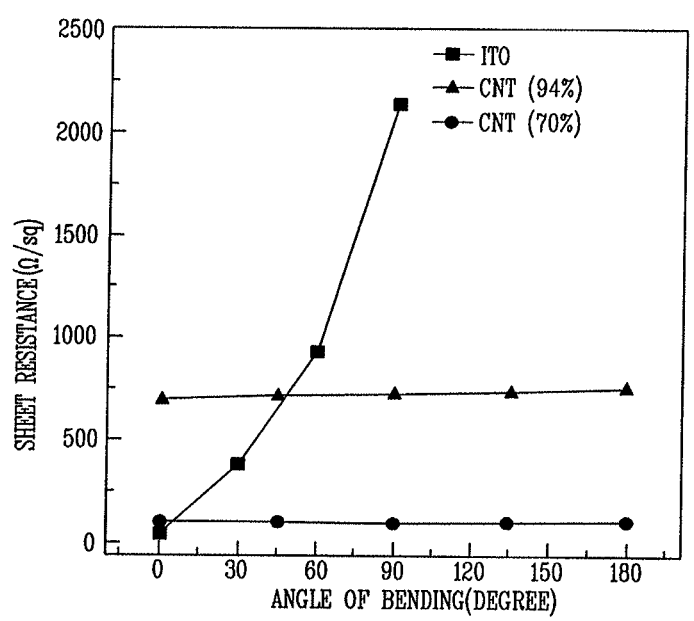
FIG. 1 is a graph showing a change in sheet resistance of an ITO electrode and single walled carbon nano-tube (SWNT) electrodes over angle of bending.

Hereinafter, a substrate having a transparent electrode for a flexible display and a method of fabricating the same according to exemplary embodiments of the present invention will be described in detail with reference to the accompanying drawings so that they can be easily practiced by those skilled in the art to which the present invention pertains.

The objects, features, aspects and advantages of the present invention will be described in detail through embodiments described hereinafter in conjunction with the accompanying drawings. However, embodiments of the present invention may, however, be implemented in many different forms and should not be construed as being limited to the embodiments set forth herein. Rather, these embodiments are provided so that this disclosure will be thorough and complete, and will fully convey the scope of the invention to those skilled in the art and are defined by the claim coverage of the present invention. Throughout the specification, the same reference numerals will be used to designate the same or like components.

In order to implement a flexible display, a transparent electrode disposed on a substrate needs to be bent as the substrate is bent. As mentioned above, in an existing process, the method of using ITO has been performed; however, when an oxide-based material is stressed, namely, when the oxide-based material is bent, it is cracked, increasing resistance to negatively affect a flexible display.

Thus, in an exemplary embodiment of the present invention, an electrode material in the form of nanowires resistant to stress such as bending, or the like, is applied and a ultraviolet (UV)-cured shape memory polymer is developed to thereby solve the foregoing problem and implement a flexible display having transparency and flexibility and being free of cracks or creases resulting from mechanical fatigue strength due to bending or folding and unfolding.

Among metals, silver (Ag) has the best conductivity. A surface of a nanoparticle of silver is made up of various crystal planes, and an anisotropic growth may be induced by using differences in reactivity of the crystal planes to obtain a longish wire shape. However, the present inventive concept is not limited to sliver and any other materials such as copper oxide (CuO), copper (Cu), zinc oxide (ZnO), and the like, may also be used.

Silver nanowire has a resistance value ranging from 80Ω to 120Ω, lower than that of an ITO film, so it is advantageous for a large scale. In addition, silver nanowire is available for a printing technique, not for deposition, and is available for fabrication of a curved surface, thus being applied to a flexible display.

Figure 2A:
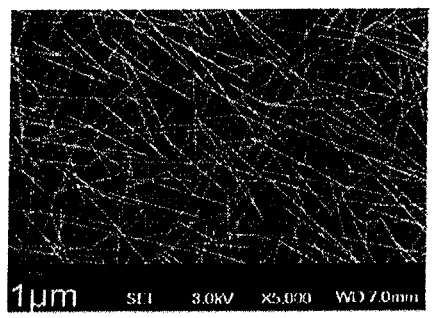
FIGS. 2A and 2B are photographs showing scanning electron microscope (SEM) and transmission electron microscope (TEM) images of silver nanowires.
Figure 2B:
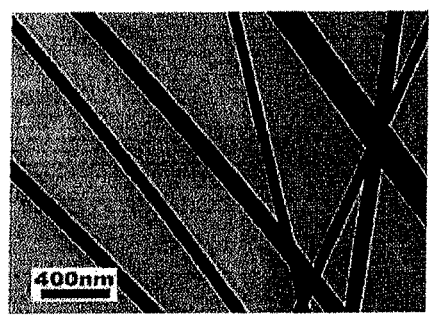

FIGS. 2A and 2B are photographs showing scanning electron microscope (SEM) and transmission electron microscope (TEM) images of silver nanowires, in which it can be seen that silver nanoparticles are grown to have a longish wire shape.

Specifically, FIG. 2A is a photograph showing an SEM image of silver nanowires coated on a glass substrate, for example.

Here, the silver nanowires have an average diameter of 60 nm, and it can be seen that the silver nanowires had an average length of approximately 6 μm when scanning electron microscope (SEM) and transmission electron microscope (TEM) images thereof were scanned.

For example, the silver nanowire electrode may be fabricated through a Meyer Rod coating method. Here, the silver nanowire film directly coated on the substrate is formed to have a thickness equal to or greater than 100 nm.

As described above, the present invention provides a simple method of fabricating a silver nanowire electrode on a transparent crosslinked polymer substrate through a continuous process.

Here, the SMP substrate having the fabricated silver nanowire transparent electrode exhibits high transparency and low sheet resistance, relative to a polyethylene terephthalate (PET) having ITO electrodes. Surface roughness of the SMP substrate having silver nanowire transparent electrodes is equal to or less than 5 nm.

According to measurement by using an atomic force microscope (AFM), it can be seen that silver nanowires coated on a glass substrate form a randomly oriented network having high density.

Figure 3:
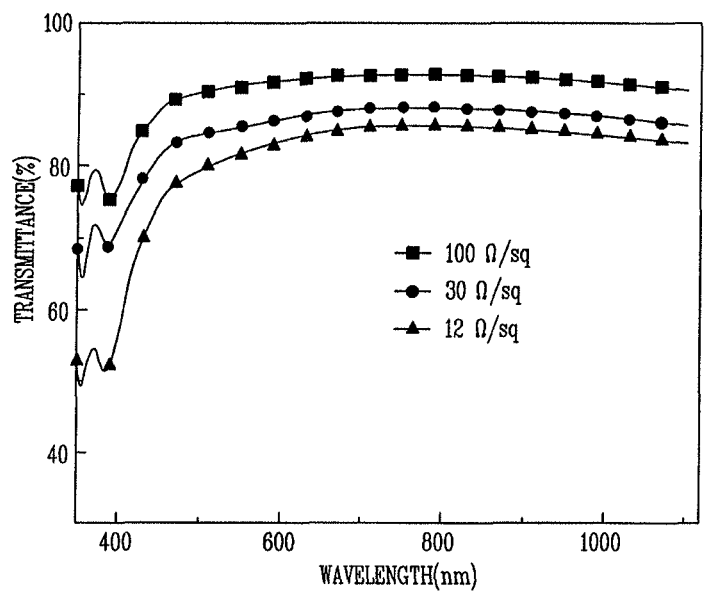
FIG. 3 is a graph showing a change in transmittance over sheet resistance of a shape memory polymer (SMP) substrate having silver nanowires.

FIG. 3 is a graph showing a change in transmittance over sheet resistance of a shape memory polymer (SMP) substrate having silver nanowires.

Specifically, FIG. 3 shows a change in transmittance over a wavelength of the SMP substrate having silver nanowires having sheet resistance of 12, 30, and 100 Ω/sq according to an exemplary embodiment of the present invention.

Referring to FIG. 3, it can be seen that transmittance of the SMP substrate having silver nanowires according to an exemplary embodiment of the present invention is equal to or greater than 80% in a wavelength of 550 nm regardless of sheet resistance.

Meanwhile, the foregoing process is appropriate for fabrication of an electrode of a polymer light emitting diode (PLED) display, a type of organic light emitting diode (OLED) display. Also, attributes of a shape memory of the UV-cured polymer substrate may be change to have various stable shapes, obtaining flexible implementation. The changed SMP substrate connected to the PLED display may be returned and electrical loss may be minimized.

For reference, OLEDs may be divided into a small molecule OLED and a polymetric molecule OLED according to a difference in molecular weights of materials used to fabricate an OLED. Also, during a fabrication process, a small molecule OLED may be mainly fabricated through coating or printing, while the polymeric molecule OLED may be fabricated by using vacuum deposition.

Also, in an exemplary embodiment of the present invention, taking advantage of the highly elastic restoration quality of the SMP substrate, when a connection portion or a bonding portion of the display is bent or folded, fatigue crack or crease is not generated.

Figure 4:
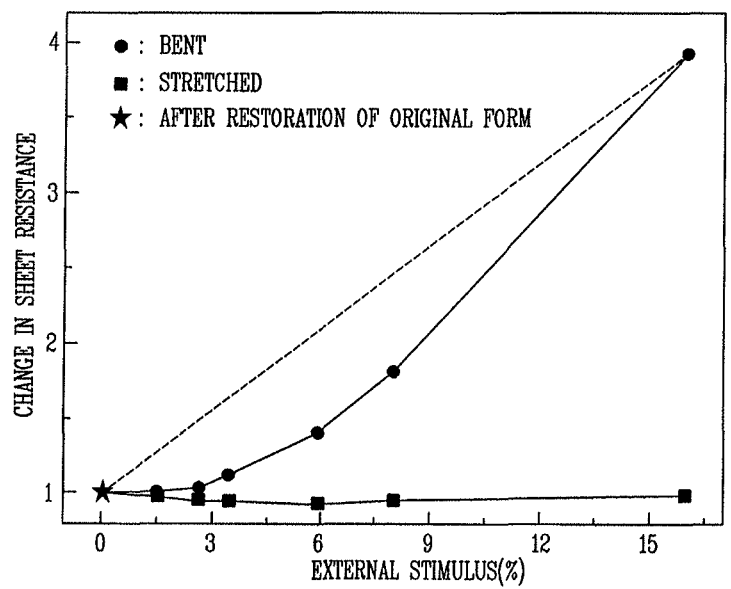
FIG. 4 is a graph showing a change in sheet resistance of the SMP substrate having silver nanowires over external stimulus.

FIG. 4 is a graph showing a change in sheet resistance of the SMP substrate having silver nanowires over external stimulus.

Figure 5:
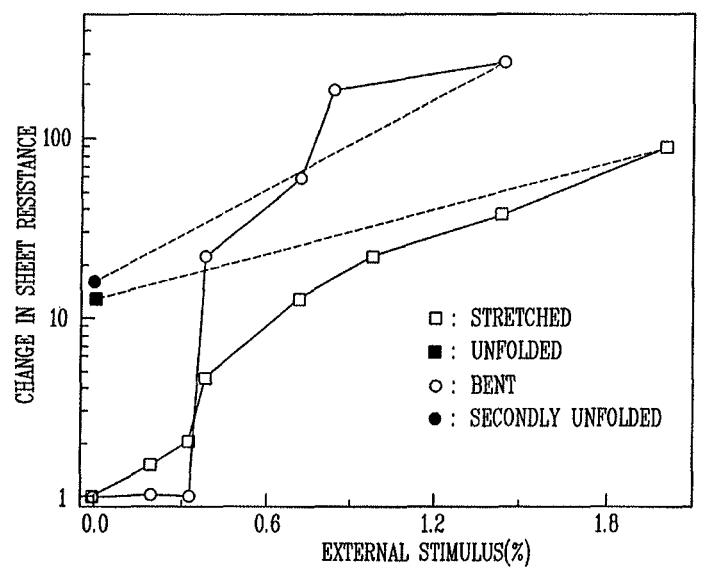
FIG. 5 is a graph showing sheet resistance of a polyethylene terephthalate (PET) substrate having ITO over external stimulus.

FIG. 5 is a graph showing sheet resistance of a polyethylene terephthalate (PET) substrate having ITO over external stimulus.

Referring to FIGS. 4 and 5, a 'change in sheet surface' refers to a ratio of sheet resistance R after deformation to initial sheet resistance RO.

Also, 'After restoration of the original form' refers to a change in resistance after the original form is restored from a bent state by heat.

In FIGS. 4 and 5, the solid lines refer to trend lines when the original form is restored, namely, when the PET substrate is unfolded to be flat. Here, in order to exhibit excellent characteristics, the trend lines R/RO should be 1.

Referring to FIG. 4, it can be seen that, in the case of the SMP substrate having silver nanowires according to an exemplary embodiment of the present invention, sheet resistance is not changed after the restoration of the original form, regardless of external stimulus when it is bent or spread.

In comparison, referring to FIG. 5, in the case of the existing PET substrate having an ITO, sheet resistance is increased tenfold due to external stimulus when the substrate is bent or spread.

Some photographs showing a bent state of the SMP substrate, a heated state of the SMP substrate at a temperature of 120° C. and a state in which the original form of the SMP substrate has been restored have been showed that the original form of the SMP substrate is completely restored by thermal stimulus.

For example, the SMP film was formed by coating a coating solution obtained by adding a photoinitiator and an additive to monomers A and B on an organic substrate through a bar coating method to have a thickness ranging from 5 μm to 10 μm and UV-cured. The film subsequently underwent experiment.

The monomer A, the monomer B, the photoinitiator, and the additive may be contained in amounts of 90, 10, 5, and 0.1 wt % over the entire 105.1 wt % (solid content 100 wt %), respectively.

For example, Ethoxylated(4) bisphenol A dimethacrylate may be used as the monomer A, and Ethoxylated(2) bisphenol A dimethacrylate may be used as the monomer B.

In this case, the monomer A and the monomer B may be used in the ratio of 9:1 to 5:5.

2,2-dimethoxy-2-phenylacetophenone may be used as the photoinitiator.

Hereinafter, a method for fabricating a substrate having a transparent electrode for a flexible display according to an exemplary embodiment of the present invention configured as described above will be described in detail.

FIGS. 6A through 6F are cross-sectional vies sequentially illustrating a method for fabricating a substrate having a transparent electrode for a flexible display according to an exemplary embodiment of the present invention. Specifically, FIGS. 6A through 6F show a method for fabricating an SMP substrate having silver nanowires.

Figure 6A:
FIGS. 6A through 6F are cross-sectional vies sequentially illustrating a method for fabricating a substrate having a transparent electrode for a flexible display according to an exemplary embodiment of the present invention.
Figure 6B:
Figure 6C:
Figure 6D:
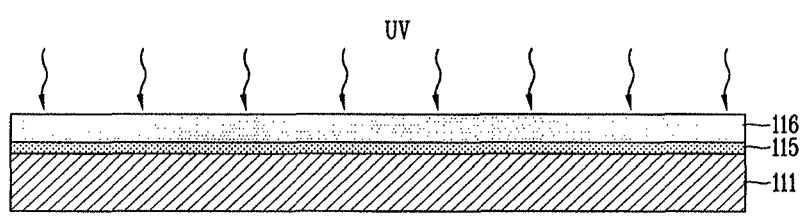
Figure 6E:
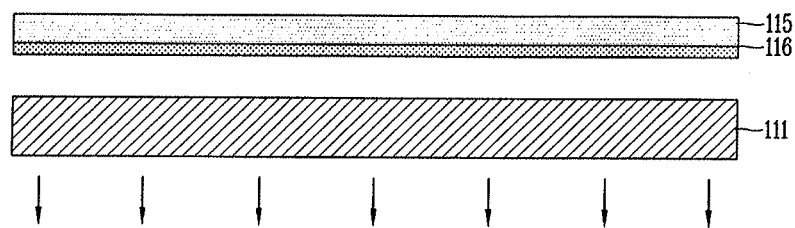
Figure 6F:
Figure 7A:
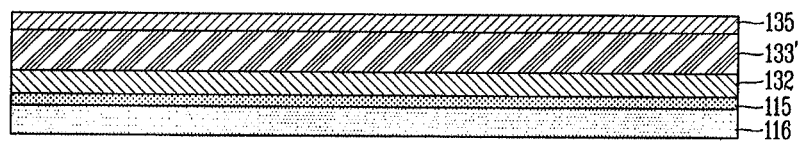
FIGS. 7A and 7B are cross-sectional views illustrating an example of a flexible display fabricated by using a substrate having a transparent electrode fabricated through FIGS. 6A through 6F.
Figure 7B:
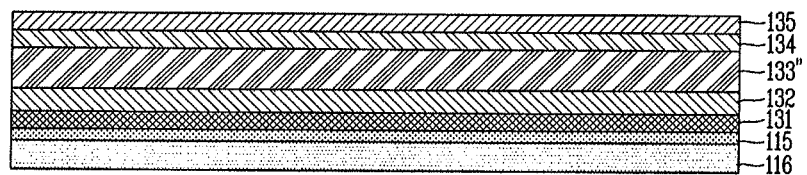

FIGS. 7A and 7B are cross-sectional views illustrating an example of a flexible display fabricated by using a substrate having a transparent electrode fabricated through FIGS. 6A through 6F.

As illustrated in FIGS. 6A and 6B, a silver nanowire dispersion liquid 121 is applied to a surface of a cleaned glass substrate 111 or film by using a spray gun 120 to form a silver nanowire electrode 115.

In this case, as mentioned above, the present inventive concept is not limited to the silver nanowire, and a material such as copper oxide (CuO), copper (Cu), zinc oxide (ZnO), or the like, may also be used.

Thereafter, the silver nanowire electrode 115 is cast by monomers of UV-cured shape memory bifunctional acrylate including a photoinitiator. Namely, as illustrated in FIG. 6C, an acrylic shape memory polymer (SMP) is applied to the glass substrate 111 coated with the silver nanowire electrode 115 to form an SMP thin film 116'.

The acrylic SMP is configured as a coating solution obtained by adding a photoinitiator and an additive to the monomers A and B, and as mentioned above, Ethoxylated(4) bisphenol A dimethacrylatemay be used as the monomer A and Ethoxylated(2) bisphenol A dimethacrylate may be used as the monomer B.

In this case, the monomer A and the monomer B may be used in the ratio of 9:1 to 5:5.

2,2-dimethoxy-2-phenylacetophenone may be used as the photoinitiator.

In this case, the monomer A, the monomer B, the photoinitiator, and the additive may be contained in amounts of 90, 10, 5, and 0.1 wt % over the entire 105.1 wt % (solid content 100 wt %), respectively.

After the coating operation, as illustrated in FIG. 6D, through UV irradiation, the silver nanowires form a solidly crosslinked cured film below the SMP substrate 116.

In this case, the silver nanowires are transferred to crosslinked poly(acrylate) coat.

During the process of curing the UV cured SMP substrate 116, the applied monomers A and B infiltrate into the silver nanowire network and rearranged in air gaps including an empty space of the interface between the glass substrate 111 and the silver nanowire electrode 115, and thereafter, polymerization forms a polymer network in which a majority of nanowires is hidden, excluding a case in which it is in contact with the surface of the glass substrate 111.

Thereafter, as illustrated in FIGS. 6E and 6F, when the glass substrate 111 is removed, the surface of the silver nanowire electrode 115 becomes conductive exposed to the new polymer substrate, namely, the SMP substrate 116.

In this manner, the SMP substrate 116 having the silver nanowire electrode 115 may be used as a TFT substrate of the foregoing OLED.

Namely, referring to FIG. 7A, in a polymetric molecule OLED, the silver nanowire electrode is formed as an anode 115 on the SMP substrate 115, and a hole transport layer 132', an emission layer 133', and a cathode 135 are sequentially stacked on the anode 115.

In this case, for example, a material of poly(3,4-ethylene dioxythiophene)poly(stylenesulfonate) (PEDOT:PSS) to form the hole transport layer 132' and a material of phenyl-substituted poly(phenylenevinylene) (Ph-PPV) to form the emission layer 133' may be deposited through spin coating. Alternatively, a solution-processable method such as screen printing, inkjet printing, stamping, nano-implant, or the like, may also be used. The polymer layer may be controlled to have a thickness ranging from about 10 nm to 200 nm.

Referring to FIG. 7B, in the small molecule OLED, a silver nanowire electrode is formed as the anode 115 on the SMP substrate 116, and a hole injection layer 131", a hole transport layer 132", an emission layer 133", an electron transport layer 134", and a cathode 135 are sequentially stacked on the anode 115.

However, the present inventive concept is not limited to the stacked structures illustrated in FIGS. 7A and 7B.

Based on the foregoing structures of the OLEDs, holes injected from the anode 115 and electrons injected from the cathode 135 are combined in the emission layers 133' and 133" by way of the transport layers 132', 132", and 134" for transportation and subsequently move to a lower energy level, generating light having a wavelength corresponding to an energy difference in the emission layers 133' and 133".

In this case, in order to emit white light, the emission layers 133' and 133" may include a red emission layer, a green emission layer, and a blue emission layer.

The foregoing embodiments and advantages are merely exemplary and are not to be considered as limiting the present disclosure. The present teachings can be readily applied to other types of apparatuses. This description is intended to be illustrative, and not to limit the scope of the claims. Many alternatives, modifications, and variations will be apparent to those skilled in the art. The features, structures, methods, and other characteristics of the exemplary embodiments described herein may be combined in various ways to obtain additional and/or alternative exemplary embodiments.

As the present features may be embodied in several forms without departing from the characteristics thereof, it should also be understood that the above-described embodiments are not limited by any of the details of the foregoing description, unless otherwise specified, but rather should be considered broadly within its scope as defined in the appended claims, and therefore all changes and modifications that fall within the metes and bounds of the claims, or equivalents of such metes and bounds are therefore intended to be embraced by the appended claims.

What is claimed is:

1. A substrate having a transparent electrode for a flexible display comprising: a substrate of a shape memory polymer (SMP) that is flexible; and a transparent electrode comprising nanowires on the substrate; wherein the SMP comprises an ultraviolet radiation (UV) cured solution including a photo-initiator, an additive and monomers A and B wherein the monomer A is made of a material selected from the group consisting of Ethoxylated(4) bisphenol A dimethacrylate, and the monomer B is formed of Ethoxytated(2) bisphenol A dimethacrylate, and the nanowires are infiltrated by the monomer A and the monomer B and the nanowires are embedded within the SMP such that the nanowires are disposed within the UV cured SMP and exposed on a surface of the SMP.

2. The substrate of claim 1, wherein the nanowires are made of a material selected from the group consisting of silver, a copper oxide (CuO), copper (Cu), or a zinc oxide (ZnO).

3. The substrate of claim 1, wherein the monomer A and the monomer B are contained in the ratio of 9:1 to 5:5 in the coating solution.

4. The substrate of claim 1, wherein the photoinitiator comprises 2,2-dimethoxy-2-phenylacetophenone.

5. A method for fabricating a substrate having a transparent electrode for a flexible display, the method comprising:
applying a nanowire dispersion solution of methanol to a glass substrate to form a nanowire electrode wherein the nanowire electrode comprises nanowires;
coating the glass substrate with the nanowire electrode formed thereon, with an acrylic shape memory polymer (SMP) to form the SMP thin film wherein the SMP is flexible and the SMP is a coating solution comprising a photoinitiator, an additive and monomers A and B, wherein the monomer A is made of a material selected from the group consisting of Ethoxylated(4) bisphenol A dimethacrylate, and the monomer B is formed of Ethoxylated(2) bisphenol A dimethacrylate, and the nanowires are infiltrated by the monomer A and the monomer B and the nanowires are infiltrated by the monomer A and the monomer B;
curing the SMP thin film through UV irradiation (UV) to form an SMP substrate, wherein the nanowires are embedded within the SMP such that the nanowires are disposed within the UV cured SMP and exposed on a surface of the SMP; and
removing the glass substrate from the SMP substrate.

6. The method of claim 5, wherein the nanowire dispersion solution is applied by using a spray gun.

7. The method of claim 5, wherein the nanowire dispersion solution forms a solidly crosslinked cured film below the SMP substrate through the UV irradiation.

8. The method of claim 5, wherein the nanowire dispersion solution is obtained by adding silver, copper oxide (CuO), copper (Cu), or zinc oxide (ZnO) to methanol.

9. The method of claim 5, wherein the monomer A, the monomer B, the photoinitiator, and the additive are contained in amounts of 90, 10, 5, and 0.1 wt % over the entire 105.1 wt % (solid content 100 wt %), respectively.

10. The method of claim 5, wherein the monomer A and the monomer B are contained in the ratio of 9:1 to 5:5 in the coating solution.

11. The method of claim 5, wherein the photoinitiator is formed of 2,2-dimethoxy-2-phenylacetophenone.

12. A substrate having a transparent electrode for a flexible display comprising: a substrate of a shape memory polymer (SMP) that is flexible; and a transparent electrode comprising nanowires on the substrate; wherein the SMP comprises an ultraviolet radiation (UV) cured solution including a photo-initiator, an additive and monomers A and B; and wherein the monomer A, the monomer B, the photoinitiator, and the additive are contained in amounts of 90, 10, 5, and 0.1 wt % over the entire 105.1 wt % (solid content 100 wt %), respectively, and the nanowires are infiltrated by the monomer A and the monomer B and the nanowires are embedded within the SMP such that the nanowires are disposed within the UV cured SMP and exposed on a surface of the SMP.

* * * * *